(12) United States Patent
Lee

(10) Patent No.: US 11,747,864 B2
(45) Date of Patent: Sep. 5, 2023

(54) DISPLAY DEVICE

(71) Applicant: SAMSUNG DISPLAY CO., LTD., Yongin-si (KR)

(72) Inventor: Hee Kwon Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/674,939

(22) Filed: Feb. 18, 2022

(65) Prior Publication Data

US 2022/0171437 A1 Jun. 2, 2022

Related U.S. Application Data

(63) Continuation of application No. 16/924,570, filed on Jul. 9, 2020, now Pat. No. 11,256,299.

(30) Foreign Application Priority Data

Jan. 10, 2020 (KR) .................. 10-2020-0003678

(51) Int. Cl.
*G06F 1/16* (2006.01)
*G09F 9/30* (2006.01)

(52) U.S. Cl.
CPC .......... *G06F 1/1656* (2013.01); *G06F 1/1652* (2013.01); *G09F 9/301* (2013.01)

(58) Field of Classification Search
CPC combination set(s) only.
See application file for complete search history.

(56) References Cited

U.S. PATENT DOCUMENTS 9,515,099 B2 * 12/2016 Kwon ................. H01L 27/1262
9,544,994 B2 * 1/2017 Kwon .................... H05K 1/028

(Continued)

OTHER PUBLICATIONS

Extended Search Report dated Jun. 15, 2021 in corresponding European Patent Appln. No. 21150436.0.

(Continued)

*Primary Examiner* — Lisa Lea-Edmonds
(74) *Attorney, Agent, or Firm* — F. Chau & Associates, LLC

(57) ABSTRACT

Provided is a display device including: a display panel in which a display area and a non-display area located around the display area are defined; an external device which is disposed on the non-display area of the display panel; and a cover member which is disposed on the external device, wherein the external device includes a driving chip and a printed circuit film which is disposed on the non-display area of the display panel and spaced apart from the display area with the driving chip interposed between the printed circuit film and the display area in plan view, and the cover member includes a first insulating tape disposed on the external device, a first conductive tape disposed on the first insulating tape and a second insulating tape disposed on the first conductive tape, wherein the second insulating tape includes an electrostatic induction opening penetrating the second insulating tape in a thickness direction, a planar size of the first conductive tape is greater than a planar size of the second insulating tape, the first conductive tape protrudes further toward the display area than the second insulating tape in plan view, and the electrostatic induction opening is disposed on a part of the first conductive tape which protrudes further toward the display area than the second insulating tape.

20 Claims, 14 Drawing Sheets

(56) References Cited

U.S. PATENT DOCUMENTS

| | | |
|---|---|---|
| 9,814,132 B2 | 11/2017 | Lee |
| 9,877,382 B2 | 1/2018 | Lee |
| 9,900,990 B2 | 2/2018 | Kim et al. |
| 10,043,827 B2 | 8/2018 | Kwon et al. |
| 10,136,513 B2 | 11/2018 | Lee |
| 10,772,208 B2 | 9/2020 | Lee |
| 11,061,439 B2 | 7/2021 | Kwon et al. |
| 11,063,230 B2 | 7/2021 | Lee et al. |
| 11,129,281 B2 | 9/2021 | Lee et al. |
| 11,256,299 B2 * | 2/2022 | Lee ................. H05K 1/0259 |
| 11,464,105 B2 * | 10/2022 | Lee ................. H05K 1/028 |
| 2015/0230331 A1 | 8/2015 | Lee |
| 2017/0277313 A1 | 9/2017 | Lee et al. |
| 2019/0174658 A1 * | 6/2019 | Qi ................. H05K 1/0219 |
| 2019/0294281 A1 * | 9/2019 | Kim ................. H10K 50/8426 |
| 2019/0305234 A1 | 10/2019 | Jung |
| 2019/0348487 A1 | 11/2019 | Kim et al. |
| 2019/0350081 A1 * | 11/2019 | Park ................. G06F 1/203 |
| 2019/0377445 A1 | 12/2019 | Jeong et al. |
| 2020/0004077 A1 | 1/2020 | Lee et al. |
| 2020/0137890 A1 | 4/2020 | Lee et al. |
| 2020/0343313 A1 | 10/2020 | Lee et al. |
| 2021/0216107 A1 * | 7/2021 | Lee ................. G06F 1/1656 |
| 2021/0259097 A1 * | 8/2021 | Lee ................. H05K 1/0259 |
| 2021/0280826 A1 * | 9/2021 | Kim ................. H10K 50/844 |
| 2022/0171437 A1 * | 6/2022 | Lee ................. H05K 1/0259 |
| 2022/0272881 A1 * | 8/2022 | Shin ................. H05K 5/0017 |

OTHER PUBLICATIONS

Notice of Allowance dated Oct. 15, 2021 in corresponding U.S. Appl. No. 16/924,570.

* cited by examiner

DR3

DISPLAY DEVICE

CROSS-REFERENCE

This U.S. non-provisional patent application is a continuation of co-pending U.S. patent application Ser. No. 16/924,570, titled DISPLAY DEVICE and filed on Jul. 9, 2020, which, in turn, claims priority under 35 U.S.C. § 119 to Korean Patent Application No. 10-2020-0003678 filed on Jan. 10, 2020 in the Korean Intellectual Property Office, the disclosure of which is incorporated by reference herein in its entirety.

FIELD

The present disclosure relates to display devices, and more particularly, to a display device that can switch between a folded state and an unfolded state.

DISCUSSION OF RELATED ART

A display device is a device for displaying an image, and generally includes a display panel such as an organic light emitting display panel or a liquid crystal display panel.

A mobile electronic device generally includes a display device to provide an image to a user. The proportion of mobile electronic devices having a larger display screen while having the same or smaller volume or thickness than conventional mobile electronic devices is increasing, and foldable display devices or bendable display devices, such as those structured to be folded and unfolded in order to provide a larger screen only when used, are also being developed.

Meanwhile, as a gap between a display panel of a display device and a surrounding set structure becomes narrow, static electricity introduced from the outside may cause a failure of the display device. In particular, when there is an insufficient bypass path of the static electricity introduced from the outside, the static electricity may flow to a driving chip and/or driving wirings around the driving chip, thereby causing a driving failure of the display device.

In addition, applying a thick structure or cover may be considered to prevent introduction of static electricity to the driving chip and the driving wirings around the driving chip. However, due to miniaturization of display devices, it may not be practical to apply an additional structure to protect the driving chip and the driving wirings around the driving chip.

SUMMARY

Embodiments of the present disclosure may provide a display device having a robust display screen resistant to external electromagnetic stress, such as, for example, an electromagnetic pulse or static electricity. However, aspects of the present disclosure are not restricted to the ones set forth herein. The above and other aspects of the present disclosure will become more apparent to those of ordinary skill in the pertinent art to which the present disclosure pertains by referencing the detailed description of the present disclosure given below.

According to an exemplary embodiment of the present disclosure, there is provided a display device including: a display panel in which a display area and a non-display area located around the display area are defined; an external device which is disposed on the non-display area of the display panel; and a cover member which is disposed on the external device, wherein the external device includes a driving chip and a printed circuit film which is disposed on the non-display area of the display panel and spaced apart from the display area with the driving chip interposed between the printed circuit film and the display area in plan view, wherein the cover member includes a first insulating tape disposed on the external device, a first conductive tape disposed on the first insulating tape and a second insulating tape disposed on the first conductive tape, wherein the second insulating tape includes an electrostatic induction opening penetrating the second insulating tape in a thickness direction, wherein a planar size of the first conductive tape is greater than a planar size of the second insulating tape, wherein the first conductive tape protrudes further toward the display area than the second insulating tape in plan view, and wherein the electrostatic induction opening is disposed on a part of the first conductive tape which protrudes further toward the display area than the second insulating tape.

The first insulating tape may be disposed between the first conductive tape and the external device, and the first conductive tape may be disposed between the first insulating tape and the second insulating tape.

The first insulating tape may include an electrostatic transfer opening overlapping the printed circuit film, and the electrostatic transfer opening may completely penetrate the first insulating tape in the thickness direction.

The cover member may further include a second conductive tape disposed in the electrostatic transfer opening, the second conductive tape may be disposed between the first conductive tape and the printed circuit film, the second conductive tape may be configured to electrically connect the first conductive tape and the printed circuit film, and the printed circuit film may be configured to receive a ground voltage.

The non-display area may further include a bending area located between the driving chip and the display area in plan view, and the display panel may be bent in the thickness direction in the bending area.

The display device may further include a bending protection layer which is disposed on the bending area of the display panel.

The display device may further include a step compensation member which is disposed between the display panel and the first insulating tape.

The step compensation member may include a first step compensation member disposed between the display panel and the first insulating tape and a second step compensation member disposed between the first step compensation member and the first insulating tape, and an inner side surface of the first step compensation member may be located farther from the bending area than an inner side surface of the second step compensation member.

Each of the first conductive tape and the second insulating tape may include a first end extending along a first direction and adjacent to the bending area and a second end extending along a second direction intersecting the first direction and connected to the first end, and the driving chip and the printed circuit film may be spaced apart from each other along the second direction.

The first end of the second insulating tape may be located closer to the external device than the first end of the first conductive tape in plan view, and the second end of the first conductive tape and the second end of the second insulating tape may be aligned with each other.

The second end of the second insulating tape may be located closer to the external device than the second end of the first conductive tape in plan view, and the first end of the first conductive tape and the first end of the second insulating tape may be aligned with each other.

The first end of the second insulating tape may be located closer to the external device than the first end of the first conductive tape in plan view, the second end of the second insulating tape may be located closer to the external device than the second end of the first conductive tape in plan view, and the first end of the first conductive tape and the first end of the second insulating tape may be aligned with each other.

Each of the first conductive tape and the second conductive tape may include a side surface adjacent to the bending area, and the side surface of the second insulating tape may be located farther from the bending area than the side surface of the first conductive tape.

A folding area extending along the first direction, a first non-folding area located on a side of the folding area in the second direction, and a second non-folding area located on the other side of the folding area in the second direction may be further defined in the display panel.

According to an exemplary embodiment of the present disclosure, there is provided a display device including: a display panel in which a display area and a non-display area located around the display area are defined; an external device which is disposed on the non-display area of the display panel; and a cover member which is disposed on the external device, wherein the external device includes a driving chip and a printed circuit film which is disposed on the non-display area of the display panel and spaced apart from the display area with the driving chip interposed between the printed circuit film and the display area in plan view, wherein the cover member includes a first insulating tape disposed on the external device, a first conductive tape disposed on the first insulating tape, a second insulating tape disposed on the first conductive tape and a conductive layer disposed on the second insulating tape, wherein the non-display area further comprises a bending area located between the driving chip and the display area in plan view and extending along a first direction, wherein when the display panel is in a first bent state, it is bent in a thickness direction in the bending area, wherein when the display panel is in a second unbent state, the driving chip and the printed circuit film are spaced apart from each other along a second direction intersecting the first direction, wherein the second insulating tape includes an edge part extending along the first direction and adjacent to the bending area, and wherein the conductive layer overlaps the edge part of the second insulating tape.

Each of the first insulating tape, the second insulating tape and the first conductive tape may include a side surface adjacent to the bending area, and the side surfaces of the first insulating tape, the second insulating tape and the first conductive tape may be exposed.

Each of the first insulating tape, the second insulating tape and the first conductive tape may include a side surface adjacent to the bending area, and the conductive layer may be further disposed on the side surfaces of the second insulating tape and the first conductive tape.

The first insulating tape may include an electrostatic transfer opening overlapping the printed circuit film, the electrostatic transfer opening may completely penetrate the first insulating tape in the thickness direction, and the cover member may further include a second conductive tape disposed in the electrostatic transfer opening, wherein the second conductive tape may be disposed between the first conductive tape and the printed circuit film, the second conductive tape may be configured to electrically connect the first conductive tape and the printed circuit film, and the printed circuit film may be configured to receive a ground voltage.

The non-display area may further include a bending area located between the driving chip and the display area in plan view, the display panel may be bent in the thickness direction in the bending area, and the display device may further include a bending protection layer disposed on the bending area of the display panel.

The display device may further include a step compensation member which is disposed between the display panel and the first insulating tape, wherein the step compensation member may include a first step compensation member disposed between the display panel and the first insulating tape and a second step compensation member disposed between the first step compensation member and the first insulating tape, and an inner side surface of the first step compensation member may be located farther from the bending area than an inner side surface of the second step compensation member.

According to an exemplary embodiment of the present disclosure, a flexible display panel includes: a display area; a non-display area located around the display area; a grounded film disposed on the non-display area and spaced apart from the display area; a cover disposed on the grounded film and comprising a first insulating tape disposed on the grounded film, a conductive tape disposed on the first insulating tape, and a second insulating tape disposed on the conductive tape, wherein the first insulating tape comprises at least one electrostatic transfer opening extending between the conductive tape and the grounded film.

The flexible display panel may include an electrostatic induction opening defined where a planar size of the conductive tape is greater than a planar size of the second insulating tape. The flexible display panel may include an electrostatic induction opening defined where the conductive tape extends further towards the display area than the second insulating tape. The flexible display panel may include an electrostatic induction opening defined where the conductive tape extends further perpendicular to the display area than the second insulating tape. The flexible display panel may be configured so the at least one electrostatic transfer opening is disposed in a part of the first insulating tape where the conductive tape extends further towards the display area than the second insulating tape to define an electrostatic induction opening.

The flexible display panel may be configured so the second insulating tape is thinner than the conductive tape, and may include a conductive layer disposed on the second insulating tape to define an electrostatic attractor. The flexible display panel may include a conductive sleeve disposed in the at least one electrostatic transfer opening between the conductive tape and the grounded film, the conductive sleeve configured to electrically connect the conductive tape to the grounded film.

BRIEF DESCRIPTION OF THE DRAWINGS

These and/or other aspects may become more apparent and more readily appreciated from the following description of exemplary embodiments, when taken in conjunction with the accompanying drawings, in which.

DETAILED DESCRIPTION

Exemplary embodiments of the present disclosure and methods of accomplishing the same may be understood more readily by reference to the following detailed description of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, where the scope of the present disclosure may only be defined by the appended claims and their equivalents.

It will be understood that when an element or layer is referred to as being "on" another element or layer, the element or layer can be directly on another element or layer or on intervening elements or layers. Like numbers may refer to like elements throughout the specification.

A display device may be used for displaying moving images or still images. The display device may be used as a display screen in portable electronic devices such as mobile phones, smartphones, tablet personal computers (PCs), smart watches, watch phones, mobile communications terminals, electronic notebooks, electronic books, portable multimedia players (PMPs), navigation systems and ultra-mobile PCs (UMPCs), as well as in various products such as televisions, notebook computers, monitors, billboards and the Internet of things (IoT). Hereinafter, embodiments will be described with reference to the attached drawings.

Figure 1:
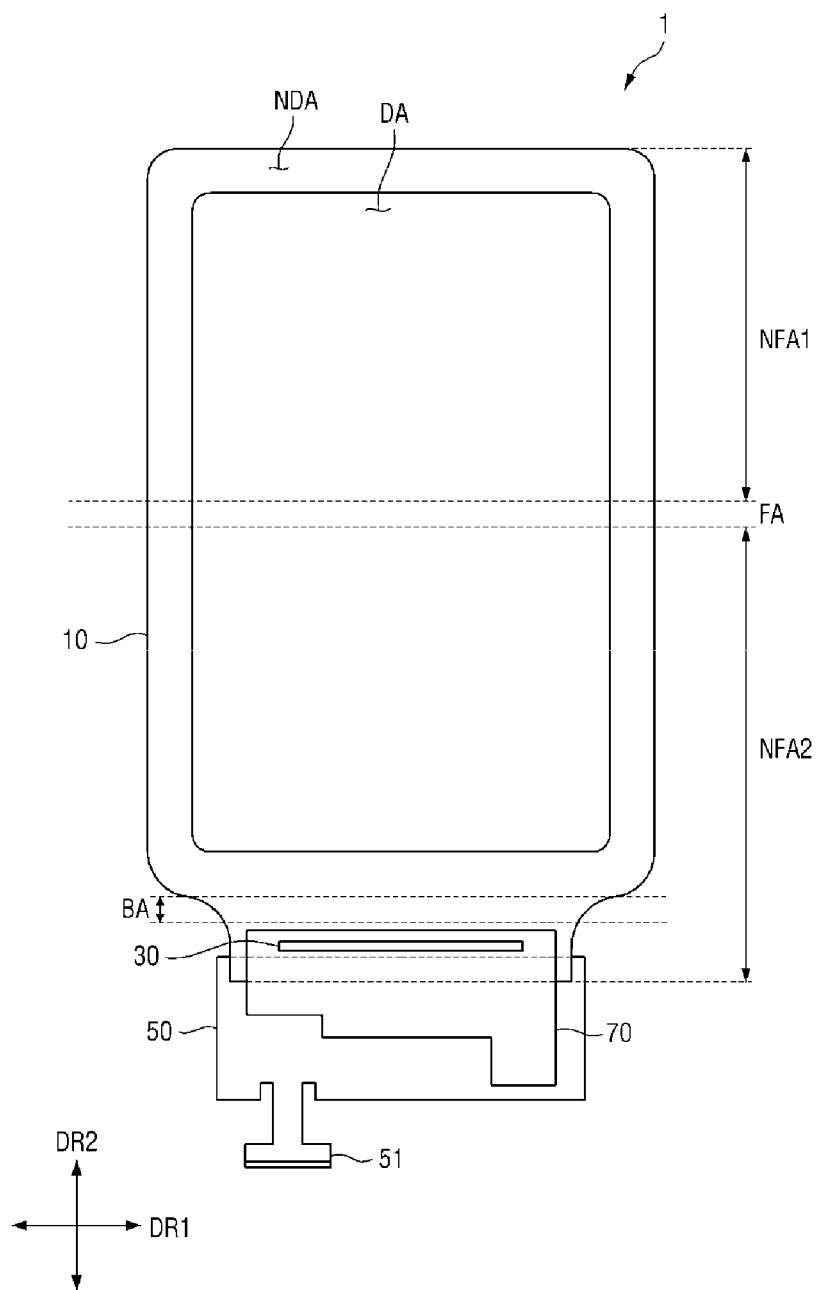
FIG. 1 is a layout diagram in plan view of a display device according to an exemplary embodiment in a first operating or unfolded state.
Figure 2:
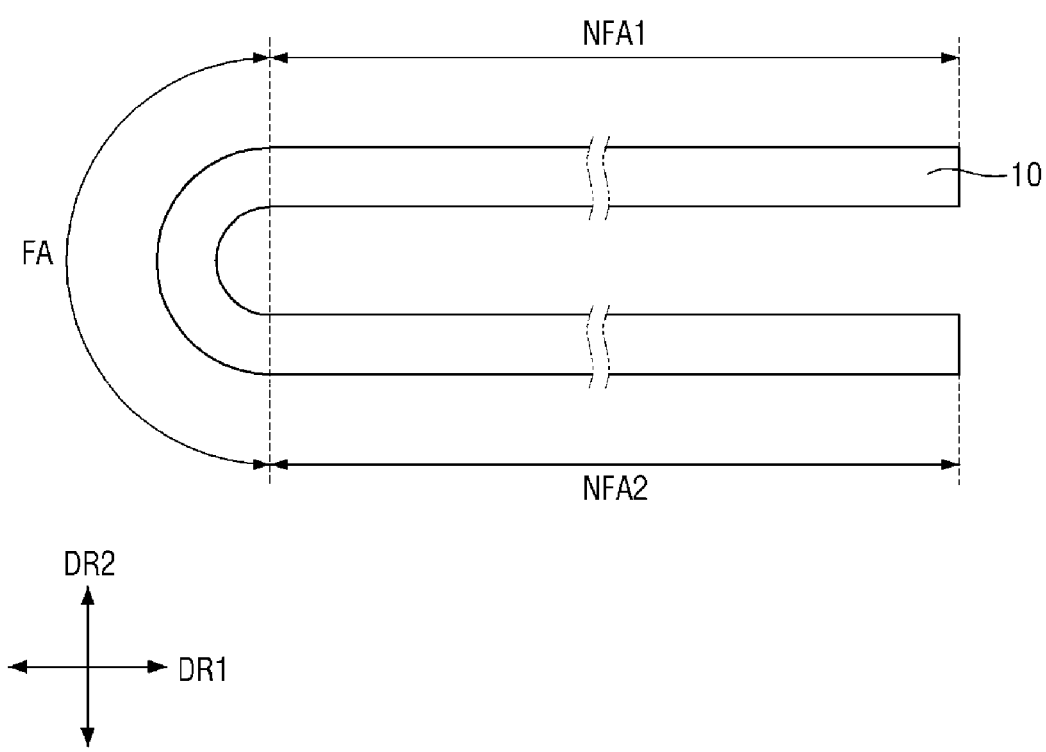
FIG. 2 is a schematic diagram in cross-sectional view of a display panel of FIG. 1 in a second operating or folded state.

FIG. 1 illustrates a plan layout view of a display device 1 according to an exemplary embodiment in a first operating or unfolded state. FIG. 2 illustrates a cross-sectional view of a display panel 10 of FIG. 1 in a second operating or folded state.

Referring to FIGS. 1 and 2, the display device 1 may display a screen or an image through a display area DA and may be any device including the display area DA. Examples of the display device 1 may include, but are not limited to, a smartphone, a mobile phone, a tablet PC, a personal digital assistant (PDA), a PMP, a television, a game machine, a wristwatch-type electronic device, a head mounted display, a monitor of a PC, a notebook computer, a car navigation system, a car dashboard, a digital camera, a camcorder, an external billboard, an electronic board, various medical devices, various examination devices, various home appliances including the display area DA, such as a refrigerator and a washing machine, and IoT devices. A representative example of a foldable display device to be described later may be, but is not limited to, a foldable smartphone, a foldable tablet PC, or a foldable notebook computer.

The display device 1 may be substantially rectangular in plan view. The display device 1 may be shaped like a rectangle with right-angled corners or a rectangle with rounded corners in plan view. The display device 1 shaped like a rectangle with rounded corners in plan view will be mainly described below. The display device 1 may include four sides or edges. The display device 1 may include long sides and short sides. The display device may have any shape in plan view, without limitation. For example, an alternate embodiment display device may be substantially trigonal, hexagonal, octagonal, or circular in plan view.

The short sides of the display device 1 may extend along a direction, and the long sides of the display device 1 may extend along another direction. For example, the short sides may extend along a first direction DR1, and the long sides may extend along a second direction DR2. In embodiments, the first direction DR1 and the second direction DR2 intersect each other in different directions. In the plan view of FIG. 1, the first direction DR1 is defined as a horizontal direction, and the second direction DR2 is defined as a vertical direction for ease of description. In the following embodiments, a first side of the first direction DR1 refers to a right direction in plan view, a second side of the first direction DR1 refers to a left direction in plan view, a first side of the second direction DR2 refers to an upper direction in plan view, and a second side of the second direction DR2 refers to a lower direction in plan view. However, directions mentioned in embodiments should be understood as relative directions, and the embodiments are not limited to the mentioned directions.

The display device 1 may include the display panel 10 displaying an image, an external device attached to the display panel 10, and a cover member 70 covering the external device. The external device may include a driving chip 30 and a printed circuit film 50 spaced apart from the driving chip 30 along the second direction DR2. The cover member 70 may completely cover the driving chip 30 and partially cover the printed circuit film 50.

The display panel 10 is a panel that displays a screen or an image. Examples of the display panel 10 may include a self-luminous display panel such as an organic light emitting display (OLED) panel, an inorganic electroluminescent (EL) display panel, a quantum dot light emitting display (QED) panel, a micro-light emitting diode (LED) display panel, a nano-LED display panel, a plasma display panel (PDP), a field emission display (FED) panel or a cathode ray tube (CRT) display panel and a light receiving display panel such as a liquid crystal display (LCD) panel or an electrophoretic display (EPD) panel. An OLED panel will hereinafter be described as an example of the display panel 10. The OLED panel applied to embodiments will be simply referred to as the display panel 10 unless a particular distinction is described. However, embodiments are not limited to the OLED panel, and other display panels listed above or known in the art are also applicable within the scope and technical spirit of the present disclosure.

The display panel 10 may include a first surface and a second surface. In the display device 1, a direction from the second surface toward the first surface of the display panel 10 may be a display direction, and a direction from the first surface toward the second surface may be a non-display direction. However, embodiments are not limited to this case, and both the direction from the second surface toward the first surface of the display panel 10 and the direction from the first surface toward the second surface may also be display directions.

The display device 1 may be a foldable device. The term "foldable device," as used herein, refers to a device that can be folded and is used to mean not only a folded device but also a device that can have both a folded state and an unfolded state. In addition, when a device is folded, it typically means that the device is folded at an angle of about 180 degrees. However, embodiments are not limited to this case. The device may also be understood as being folded even when the folding angle is greater or less than 180 degrees, for example, 90 to less than 180 degrees or 120 to less than 180 degrees. Furthermore, the device may be referred to as being in the folded state when it is folded out of the unfolded state although it is not completely folded to its maximum folding angle (e.g., 180 degrees). For example, even when the device is folded at an angle of 90 degrees or less, it may be expressed as being in the folded state to distinguish its state from the unfolded state as long as the maximum folding angle is 90 degrees or more. When the device is folded, a radius of curvature may be, but is not limited to, 5 mm or less, preferably in the range of 1 to 2 mm, or about 1.5 mm.

Hereinafter, the folded state described above may be referred to as the first operating state, and the unfolded state described above may be referred to as the second operating state.

A folding area FA, such as at a folding axis, and non-folding areas NFA1 and NFA2, such as away from the folding axis, may be defined in the display panel 10.

As illustrated in FIG. 2, the display panel 10 may be folded based on the folding area FA, or the folding axis, in the second operating state.

The folding area FA may have a linear shape extending along the first direction DR1 in plan view. Although the folding area FA extends parallel to the short sides of the display device 1 in the drawings, embodiments are not limited to this case. The folding area FA may also be parallel to the long sides or inclined with respect to the short sides and the long sides.

In an embodiment, the folding area FA of the display device 1 may be set at a specific position. In the display device 1, the number of the folding areas FA set at specific positions may be one or two or more. In an embodiment, the position of the folding area FA in the display device 1 need not be fixed but may be freely set in various areas.

A first non-folding area NFA1 may be located on a first side of the folding area FA in the second direction DR2, and a second non-folding area NFA2 may be located on a second side of the folding area FA in the second direction DR2. When the folding area FA is set at a specific position, the first non-folding area NFA1 and the second non-folding area NFA2 may be set as areas that are not folded.

The display panel 10 may, in plan view, be divided into the display area DA displaying an image and a non-display area NDA disposed around the display area DA, according to whether an image is displayed.

The display area DA may include a plurality of pixels. Each of the pixels is a basic unit for displaying a screen. The pixels may include, but are not limited to, red pixels, green pixels, and blue pixels. The pixels may further include white pixels. The pixels may be alternately arranged in plan view. For example, the pixels may be arranged in a matrix direction.

The non-display area NDA may be disposed around the display area DA. The non-display area NDA may surround the display area DA. In an embodiment, the display area DA may be rectangular, and the non-display area NDA may be disposed around four sides of the display area DA.

The rectangular shape of the display area DA may include, for example, short sides extending along the first direction DR1 and long sides extending along the second direction DR2. The non-display area NDA may be disposed around the short sides and the long sides of the display area DA. A black matrix may be disposed on the non-display area NDA of the display panel 10 to prevent leakage of light emitted from adjacent pixels.

The display area DA of the display panel 10 may be disposed over both the first non-folding area NFA1 and the second non-folding area NFA2. Furthermore, the display area DA may be located in the folding area FA corresponding to a boundary between the first non-folding area NFA1 and the second non-folding area NFA2. That is, the display area DA of the display device 1 may be continuously disposed regardless of boundaries between the non-folding areas NFA1 and NFA2 and the folding area FA. However, embodiments are not limited to this case, and the display area DA may also be disposed in the first non-folding area NFA1 but need not be disposed in the second non-folding area NFA2. Alternatively, the display area DA may be disposed in the first non-folding area NFA1 and the second non-folding area NFA2 but need not be disposed in the folding area FA.

Like the display area DA, the non-display area NDA may be located in the first non-folding area NFA1, the second non-folding area NFA2, and the folding area FA.

Referring to FIG. 2, in the second operating state, the display device 1 may be in-folded such that parts of the first surface of the display panel 10 face each other. In the second operating state, the display device 1 may be folded such that a surface of the first non-folding area NFA1 of the display panel 10 faces a surface of the second non-folding area NFA2.

In some embodiments, the display device 1 may be out-folded such that parts of the second surface of the display panel 10 face each other. The display device 1 might be only in-folded or out-folded or may be both in-folded and out-folded. The display device 1 that can be both in-folded and out-folded may be in-folded and out-folded based on the same folding area FA or may include a plurality of folding areas FA that are folded differently based on an in-folding line or axis and an out-folding line or axis.

The non-display area NDA disposed around the long sides and the short sides of the display area DA may have, for example, a substantially quadrilateral frame shape with rounded corners in plan view. A quadrilateral frame shape with rounded corners may be formed by an outer profile of the display area DA, first and second outer profiles (where the first outer profile is adjacent to a long side of the display area DA on the second side of the first direction DR1, and the second outer profile is opposite the first outer profile) of the non-display area NDA which are adjacent to the long sides of the display area DA and extend along the second direction DR2, a third outer profile of the non-display area NDA which is adjacent to a short side of the display area DA on the first side of the second direction DR2 and extends along the first direction DR1, a fourth outer profile of the non-display area NDA which is adjacent to a short side of the display area DA on the second side of the second direction DR2 and extends along the first direction DR1, and four curved profiles which connect adjacent outer profiles of the non-display area NDA.

The non-display area NDA adjacent to the short side of the display area DA located on the second side of the second direction DR2 may further include a protruding part which protrudes further outward than the fourth outer profile. A width of the protruding part of the non-display area NDA in the first direction DR1 may be smaller than a width of the fourth outer profile in the first direction DR1. The width of the protruding part of the non-display area NDA in the first direction DR1 may be gradually reduced toward the second side of the second direction DR2, but embodiments are not limited to this case.

The protruding part may include a bending area BA. The bending area BA may have a line shape extending along the first direction DR1. The bending area BA may overlap the fourth outer profile. However, embodiments are not limited to this case, and the bending area BA may also be located closer to the second side of the second direction DR2 than the fourth outer profile. In the bending area BA of the non-display area NDA, the display panel 10 may be bent in a thickness direction. The display device 1 according to the embodiment may be not only a foldable device but also a bendable device in which the display panel 10 can be bent. The display panel 10 may be bent based on the bending area BA. When the display device 1 is bent, parts of the second surface of the display panel 10 may face each other.

The protruding part may be surrounded by a first curved profile connecting the first outer profile and the fourth outer profile, a second curved profile connecting the second outer profile and the fourth outer profile, a fifth outer profile connecting the first curved profile and the second curved profile, and the fourth outer profile. The fifth outer profile may extend along the first direction DR1. Each of the curved profiles may have, but is not limited to, a curved shape protruding inward.

The external device may be attached to a second side of the bending area BA of the protruding part in the second direction DR2. An attachment position of the driving chip 30 may be located between an attachment position of the printed circuit film 50 and the bending area BA. In the first operating state, the driving chip 30 may be located between the printed circuit film 50 and the display area DA or between the printed circuit film 50 and the bending area BA in plan view.

The driving chip 30 may include a driving integrated circuit configured to apply a data voltage to each pixel and control data voltage application and/or scan signal application. A plurality of driving pads may be disposed at the attachment position of the driving chip 30 in the non-display area NDA, and the driving chip 30 may be attached to the driving pads.

The printed circuit film 50 may be configured to provide a data voltage signal and a data voltage application control signal and/or a scan signal application control signal to the driving chip 30. In addition, the printed circuit film 50 may be configured to provide a high-voltage potential signal and a low-voltage potential signal to each pixel.

The printed circuit film 50 may further include a connector 51 located at an end on the second side of the second direction DR2. The connector 51 may be connected to a main circuit board.

The cover member 70 may be disposed on the driving chip 30 and the printed circuit film 50. The cover member 70 may overlap the whole of the driving chip 30 and part of the printed circuit film 50. The cover member 70 may be disposed on the attachment positions of the driving chip 30 and the printed circuit film 50 on the non-display area NDA of the display panel 10.

Figure 3:
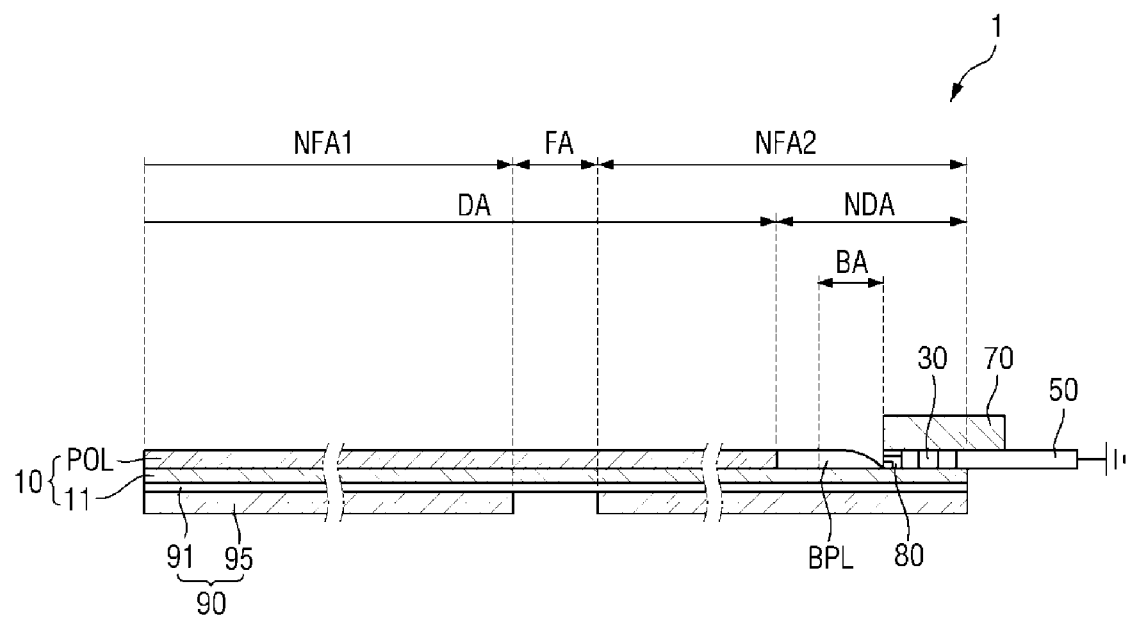
FIG. 3 is a schematic diagram in cross-sectional view of the display device of FIG. 1 when in an unbent state.
Figure 4:
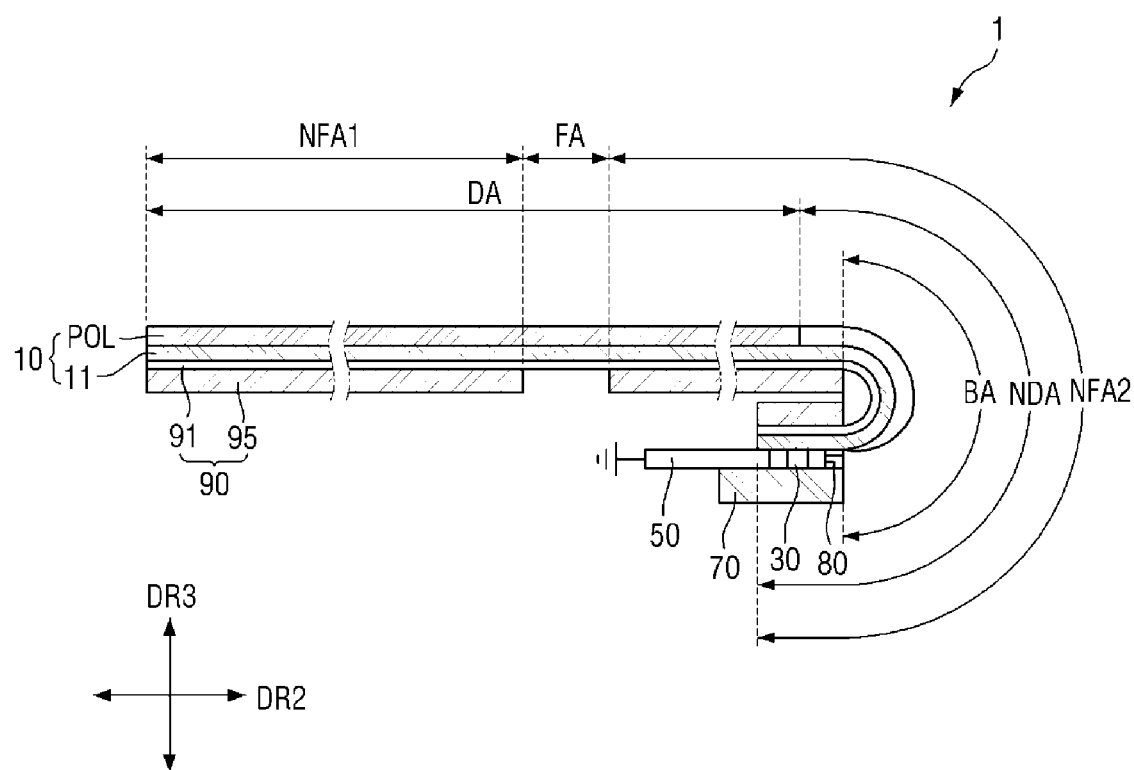
FIG. 4 is a schematic diagram in cross-sectional view of the display device of FIG. 1 when in a bent state.
Figure 5:
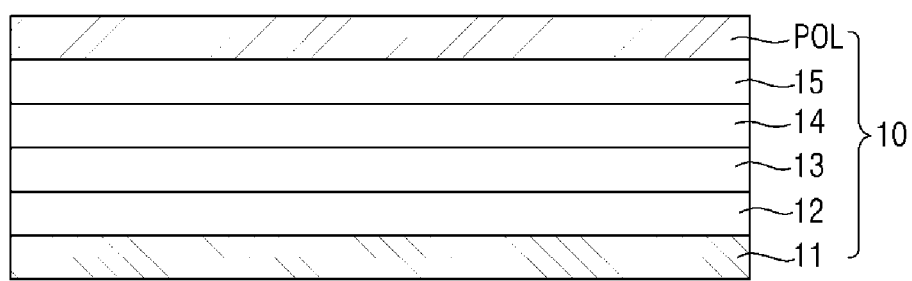
FIG. 5 is a schematic diagram in cross-sectional view of a display panel according to an exemplary embodiment.

FIG. 3 illustrates a cross-sectional view of the display device 1 of FIG. 1 when unbent. FIG. 4 illustrates a cross-sectional view of the display device 1 of FIG. 1 when bent. FIG. 5 illustrates a cross-sectional view of a display panel 10 according to an embodiment.

Referring to FIGS. 3 through 5, the display panel 10 may include a plurality of elements. For example, the display panel 10 may include a substrate 11 and a circuit driving layer 12 disposed on the substrate 11. The circuit driving layer 12 may include a circuit for driving a light emitting layer 13 of each pixel. The circuit driving layer 12 may include a plurality of thin-film transistors. The light emitting layer 13 may be disposed on the circuit driving layer 12. The light emitting layer 13 may include an organic light emitting layer. The light emitting layer 13 may emit light of various luminance levels according to a driving signal received from the circuit driving layer 12. An encapsulating layer 14 may be disposed on the light emitting layer 13. The encapsulating layer 14 may include an inorganic layer or a laminate of an inorganic layer and an organic layer. Alternatively, the encapsulating layer 14 may be glass or an encapsulating film. A touch layer 15 may be disposed on the encapsulating layer 14. The touch layer 15 is a layer for recognizing a touch input and may function as a touch member. The touch layer 15 may include a plurality of sensing regions and sensing electrodes. A polarizing layer POL may be disposed on the touch layer 15. The polarizing layer POL may reduce reflection of external light. The polarizing layer POL may be attached to the touch layer 15 through an adhesive layer. The polarizing layer POL is optional. A protective layer may be disposed on the polarizing layer POL. The protective layer may include, for example, a window member. The protective layer may be attached onto the polarizing layer POL by, e.g., an optically clear adhesive.

In FIGS. 3 and 4, only the substrate 11 and the polarizing layer POL disposed on the substrate 11 are illustrated by simplifying the cross-sectional structure of the display panel 10 for ease of description.

The polarizing layer POL may be disposed on a first surface of the substrate 11. Like the first surface of the display panel 10 described above with reference to FIGS. 1 and 2, the first surface of the substrate 11 may be an upper surface of the substrate 11 in the drawings, and a second surface of the substrate 11 may be a surface (a lower surface) opposite the first surface of the substrate 11. The polarizing layer POL may be disposed in the display area DA and may not be disposed in the non-display area NDA.

The display device 1 may further include an under-panel sheet 90 disposed on the second surface of the substrate 11. The under-panel sheet 90 may include a polymer film layer 91 and a metal plate 95 disposed under the polymer film layer 91.

The polymer film layer 91 may include a polymer film. The polymer film layer 91 may include, for example, polyimide (PI), polyethylene terephthalate (PET), polycarbonate (PC), polyethylene (PE), polypropylene (PP), polysulfone (PSF), polymethyl methacrylate (PMMA), triacetyl cellulose (TAC), or cyclo olefin polymer (COP). The polymer film layer 91 may include a functional layer on at least one surface. The functional layer may include, for example, a light absorbing layer. The light absorbing layer may include a light absorbing material such as a black pigment or dye. The light absorbing layer may be formed on the polymer film by coating or printing black ink.

The metal plate 95 dissipates heat generated from the display panel 10 or other parts of the display device 1. The metal plate 95 may include a metallic plate. The metallic plate may contain a metal with excellent thermal conductivity, such as copper or silver. The metal plate 95 may also be a heat dissipating sheet containing graphite or carbon nanotubes.

The metal plate 95 may be divided by a folding line FDA as illustrated in FIGS. 3 and 4 to facilitate the folding of the display device 1, although embodiments are not limited to this case. For example, a first metal plate may be disposed in the first non-folding area NFA1, and a second metal plate may be disposed in the second non-folding area NFA2. The first metal plate and the second metal plate may be physically separated by the folding line FDA.

The display device 1 may further include a bending protection layer BPL. The bending protection layer BPL may be disposed on the first surface of the substrate 11 in the bending area BA.

The bending protection layer BPL may alleviate stress applied to a signal line (e.g., a signal line connecting each pixel and a driving pad) passing through the bending area BA, thereby preventing creation of cracks in the signal line.

For example, the bending protection layer BPL may include an organic material. The organic material may include a photosensitive organic material. For example, the bending protection layer BPL may include an acrylic material.

The bending protection layer BPL may extend further toward the display area DA from the bending area BA. The bending protection layer BPL may contact an outer side surface of the polarizing layer POL. However, embodiments are not limited to this case, and the bending protection layer BPL need not contact the outer side surface of the polarizing layer POL.

The driving chip 30, the printed circuit film 50 and a step compensation member 80 may be disposed on a first side of the bending area BA in the second direction DR2 in the non-display area NDA of the display panel 10. The step compensation member 80 may be disposed between the driving chip 30 and the bending protection layer BPL, and the driving chip 30 may be disposed between the step compensation member 80 and the printed circuit film 50.

The cover member 70 may be disposed on the step compensation member 80, the driving chip 30, and the printed circuit film 50.

A ground voltage may be applied to the printed circuit film 50. For example, the printed circuit film 50 may be grounded.

As illustrated in FIG. 4, when the display device 1 is bent, parts of the second surface of the display panel 10 may face each other. Each of the attachment position of the driving chip 30 and the attachment position of the printed circuit film 50 may overlap the non-display area NDA between the display area DA and the bending area BA of the display panel 10 in the thickness direction.

As the display device 1 is bent, the printed circuit film 50 may be positioned inside the driving chip 30 (for example, in a direction toward the display area DA), and conversely, the driving chip 30 may be positioned outside the printed circuit film 50 (for example, in a direction opposite to the direction toward the display area DA).

When the display device 1 is bent, since the driving chip 30 is positioned outside the printed circuit film 50 (for example, in the direction opposite to the direction toward the display area DA), it may be located on the periphery of the display device 1. The driving chip 30 located on the periphery and driving pads connected to the driving chip 30 may be vulnerable to static electricity introduced directly from the outside. In addition, since the driving chip 30 and the driving pads connected to the driving chip 30 are disposed adjacent to a surrounding set structure, they may be vulnerable to static electricity transferred from the surrounding set structure into which static electricity has been initially introduced. The static electricity introduced directly from the outside and the static electricity introduced indirectly may cause a failure of the driving chip 30 and the driving pads, if no other electrostatic discharge path is provided, and the failure may cause a screen failure of the display device 1.

Figure 6:
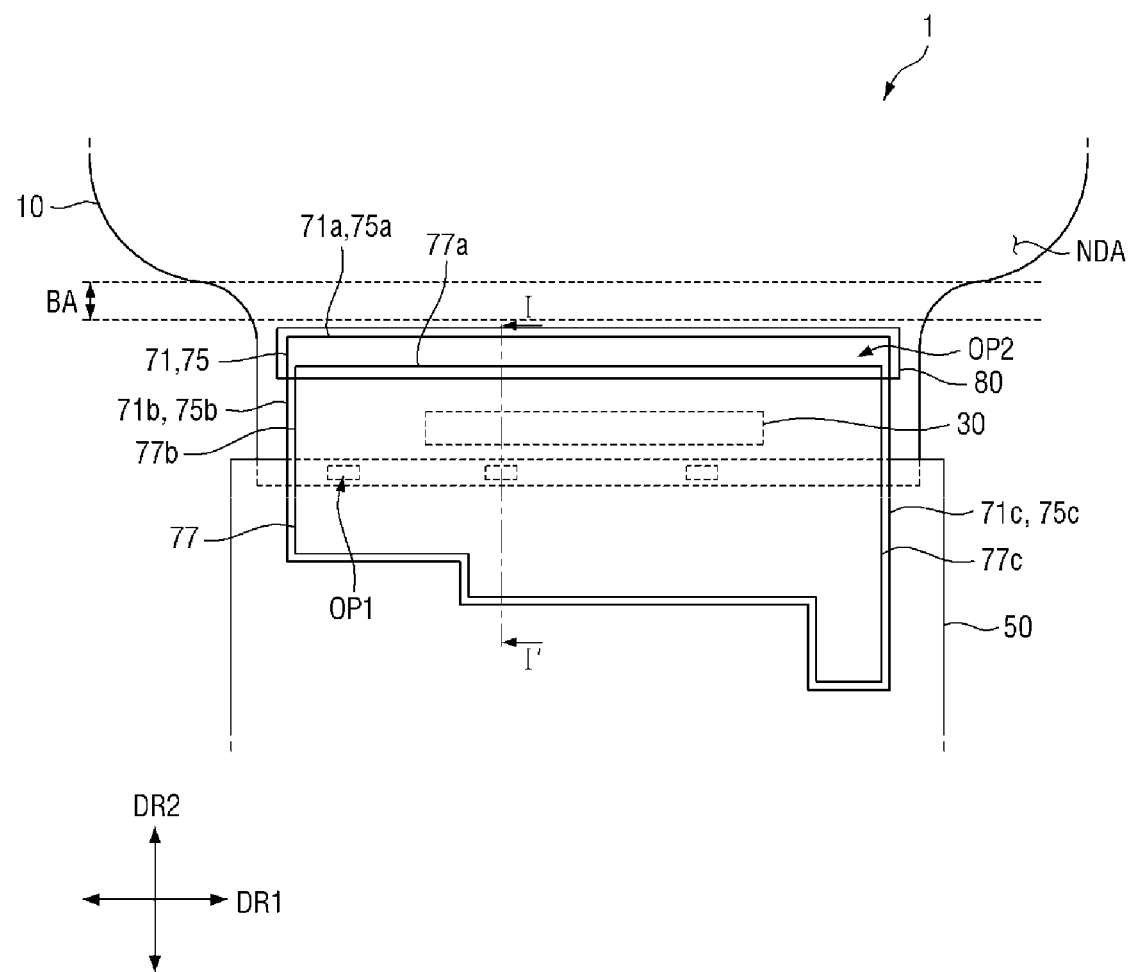
FIG. 6 is partial layout diagram in a plan view of a non-display area of the display panel of the display device according to the embodiment of FIG. 1, with a driving chip, a printed circuit film, a cover member, and a step compensation member when the display device is unbent.
Figure 7:
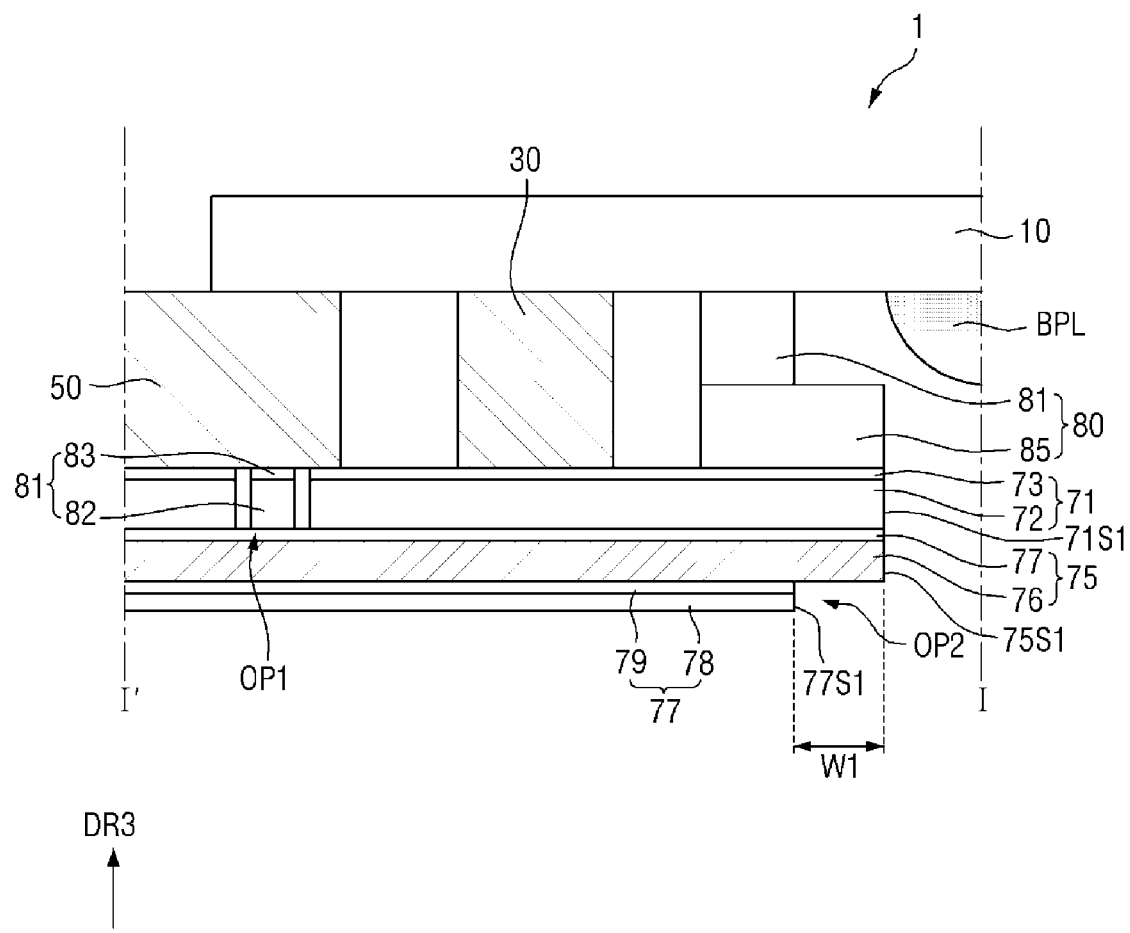
FIG. 7 is a schematic diagram in cross-sectional view taken along line I-I' of the display device of FIG. 6 when the display device is bent.

FIG. 6 illustrates a plan view of the non-display area NDA of the display panel 10 of the display device 1 according to the embodiment, including the driving chip 30, the printed circuit film 50, the cover member 70, and the step compensation member 80 when the display device 1 is unbent. FIG. 7 illustrates a cross-sectional view taken along line I-I' of the display device 1 of FIG. 6 when the display device 1 is bent. Since FIG. 7 is a cross-sectional view of the display device 1 of FIG. 6 when the display device 1 is bent, the external device is disposed under the display panel 10, and the cover member 70 is disposed under the external device in the drawing.

Referring to FIGS. 6 and 7, the cover member 70 may completely cover the driving chip 30 and partially cover the printed circuit film 50. The cover member 70 may include a first insulating tape 71 disposed on the external device, a first conductive tape 75 disposed on the first insulating tape 71, and a second insulating tape 77 disposed on the first conductive tape 75. The first insulating tape 71 may include electrostatic transfer openings OP1. This may be described later in greater detail.

A planar size of the first insulating tape 71 may be substantially equal to a planar size of the first conductive tape 75. The planar size of the first conductive tape 75 may be greater than a planar size of the second insulating tape 77. In other words, the planar size of the second insulating tape 77 may be smaller than the planar size of the first conductive tape 75.

The cover member 70 may have a substantially rectangular planar shape. The cover member 70 may include a first end extending along the first direction DR1 and adjacent to the bending area BA in plan view and second and third ends connected to the first end and extending along the second direction DR2. The second end of the cover member 70 may face and be adjacent to a profile of the protruding part of the display panel 10 on the second side of the first direction DR1, and the third end of the cover member 70 may face and be adjacent to a profile of the protruding part of the display panel 10 on the first side of the first direction DR1. The first end of the cover member 70 may include a straight line extending along the first direction DR1. The first end of the cover member 70 may be composed of one straight line extending along the first direction DR1. In some embodiments, the first end may be composed of a plurality of straight lines extending in different directions. Each of the second and third ends of the cover member 70 may include a straight line extending along the second direction DR2. Each of the second and third ends of the cover member 70 may be composed of one straight line extending along the second direction DR2. In some embodiments, each of the second and third ends may be composed of a plurality of straight lines extending in different directions. Each of the first insulating tape 71, the first conductive tape 75, and the second insulating tape 77 may include ends corresponding to the first through third ends of the cover member 70.

For example, the first insulating tape 71, the first conductive tape 75 and the second insulating tape 77 may respectively include first ends 71a, 75a and 77a corresponding to the first end of the cover member 70, second ends 71b, 75b and 77b corresponding to the second end of the cover member 70, and third ends 71c, 75c and 77c corresponding to the third end of the cover member 70. The ends of each of the first insulating tape 71, the first conductive tape 75 and the second insulating tape 77 may be substantially the same as the corresponding ends of the cover member 70 in extending direction and position.

The second ends 71b and 75b of the first insulating tape 71 and the first conductive tape 75 may be aligned with the second end 77b of the second insulating tape 77, and the third ends 71c and 75c of the first insulating tape 71 and the first conductive tape 75 may be aligned with the third end 77c of the second insulating tape 77.

On the other hand, the first ends 71a and 75a of the first insulating tape 71 and the first conductive tape 75 may not be aligned with the first end 77a of the second insulating tape 77 and may be asymmetrical to the first end 77a of the second insulating tape 77 in the thickness direction. For example, the first ends 71a and 75a of the first insulating tape 71 and the first conductive tape 75 may be located closer to the bending area BA than the first end 77a of the second insulating tape 77. As described above, the planar size of the second insulating tape 77 may be smaller than the planar size of the first conductive tape 75. This may be because the first end 77a of the second insulating tape 77 is located farther from the bending area BA than the first ends 71a and 75a of the first insulating tape 71 and the first conductive tape 75.

Since the planar size of the second insulating tape 77 is smaller than the planar size of the first conductive tape 75 and the first end 77a of the second insulating tape 77 is located farther from the bending area BA than the first ends 71a and 75a of the first insulating tape 71 and the first conductive tape 75, each of the first insulating tape 71 and the first conductive tape 75 may be located closer to the display area DA or the bending area BA than the first end 77a of the second insulating tape 77. In other words, the second insulating tape 77 may be located farther from the display area DA or the bending area BA than the first ends 71a and 75a of the first insulating tape 71 and the first conductive tape 75. The second insulating tape 77 may be located closer to the external device than the first ends 71a and 75a of the first insulating tape 71 and the first conductive tape 75.

An electrostatic induction opening OP2 of the second insulating tape 77 may be located in a part of each of the first insulating tape 71 and the first conductive tape 75 which protrudes further toward the display area DA or the bending area BA than the first end 77a of the second insulating tape 77. In plan view, the electrostatic induction opening OP2 may be surrounded by the first end 75a, the second end 75b and the third end 75c of the first conductive tape 75 and the first end 77a of the second insulating tape 77. The electrostatic induction opening OP2 may completely penetrate the second insulating tape 77 in the thickness direction from a surface of the second insulating tape 77.

In the electrostatic induction opening OP2, a part of the first conductive tape 75 which protrudes further toward the display area DA or the bending area BA than the first end 77a of the second insulating tape 77 may be completely exposed to the outside.

The electrostatic transfer openings OP1 may completely penetrate the first insulating tape 71 from a surface of the first insulating tape 71. The electrostatic transfer openings OP1 may overlap the cover member 70 and the printed circuit film 50 in the thickness direction. The electrostatic transfer openings OP1 may overlap the display panel 10 in the thickness direction, but embodiments are not limited to this case. Although three electrostatic transfer openings OP1 are illustrated in FIG. 6, the number of the electrostatic transfer openings OP1 may also be one, two, or four or more.

The step compensation member 80 may be disposed between the bending area BA and the driving chip 30 in plan view. The step compensation member 80 may compensate for a step or a space created between the display panel 10 and the cover member 70 due to the external device. The step compensation member 80 may prevent warpage of the cover member 70 by compensating for the step or the space between the display panel 10 and the cover member 70. Therefore, the step compensation member 80 may include a material having a certain degree of strength or rigidity.

The step compensation member 80 may include a first step compensation member 81 disposed on the display panel 10 and a second step compensation member 85 disposed on the first step compensation member 81. The first step compensation member 81 may be disposed between the second step compensation member 85 and the display panel 10. The first step compensation member 81 and the second step compensation member 85 may overlap each other in the thickness direction. The second step compensation member 85 may further include a part protruding further toward the bending are BA than the first step compensation member 81. In other words, the first step compensation member 81 may further include a part recessed further toward the external device than the second step compensation member 85. The recessed part of the first step compensation member 81 may be designed to avoid interference between a bending protection layer material flowing around the step compensation member 80 and the step compensation member 80 because the bending protection layer material may flow around the step compensation member 80 when the bending protection layer BPL is coated in the bending area BA.

The first insulating tape 71 may protect the driving chip 30 by completely covering the driving chip 30.

The first insulating tape 71 may include a first base 72 and a first bonding layer 73, the first conductive tape 75 may include a second base 76 and a second bonding layer 77, and the second insulating tape 77 may include a third base 78 and a third bonding layer 79.

Each of the bases 72 and 78 may include at least one of polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), and cyclo olefin polymer (COP).

Each of the bonding layers 73, 77 and 79 may include an adhesive layer, a sticky layer, or a resin layer. For example, each of the bonding layers 73, 77 and 79 may contain a polymer material classified as silicone-based, urethane-based, silicone-urethane (SU) hybrid polymer, acrylic-based, isocyanate-based, polyvinyl alcohol-based, gelatin-based, vinyl-based, latex-based, polyester-based, or aqueous polyester-based. In an embodiment, the second bonding layer 77 may further include a conductive material.

The second base 76 may include a conductive layer. The conductive layer may include a metal or a metal oxide.

In each of the electrostatic transfer openings OP1, the first insulating tape 71 may be completely penetrated in the thickness direction. A second conductive tape 81 may be further disposed in each of the electrostatic transfer openings OP1. The cover member 70 may further include the second conductive tape 81. The second conductive tape 81 may include a fourth base 82 and a fourth bonding layer 83. The fourth base 82 may include a conductive layer. The conductive layer may include a metal or a metal oxide. The fourth bonding layer 83 may include an adhesive layer, a sticky layer, or a resin layer. In an embodiment, the fourth bonding layer 83 may further include a conductive material.

The first base 72 may be bonded to the driving chip 30, the printed circuit film 50 and the step compensation member 80 through the first bonding layer 73, the second base 76 may be bonded to the first base 72 through the second bonding layer 77, the third base 78 may be bonded to the second base 76 through the third bonding layer 79, the fourth base 82 may be bonded to the second base 76 through the second bonding layer 77, and the fourth base 82 may be bonded to the printed circuit film 50 through the fourth bonding layer 83.

The first insulating tape 71, the first conductive tape 75 and the second insulating tape 77 may respectively include side surfaces 71S1, 75S1 and 77S1 of the first ends 71a, 75a and 77a adjacent to the bending area BA. The side surface 71S1 of the first insulating tape 71 and the side surface 75S1 of the first conductive tape 75 may be aligned in the thickness direction. The side surface 77S1 of the second insulating tape 77 may be located farther from the bending area BA than the side surface 71S1 of the first insulating tape 71 and the side surface 75S1 of the first conductive tape 75. In other words, the side surface 71S1 of the first insulating tape 71 and the side surface 75S1 of the first conductive tape 75 may be located closer to the bending area BA than the side surface 77S1 of the second insulating tape 77, and the side surface 77S1 of the second insulating tape 77 may be located closer to the external device than the side surface 71S1 of the first insulating tape 71 and the side surface 75S1 of the first conductive tape 75.

A gap W1 between the side surface 77S1 of the second insulating tape 77 and the side surface 75S1 of the first conductive tape 75 may be equal to a gap between the first end 77a of the second insulating tape 77 and the first end 75a of the first conductive tape 75. The gap W1 between the side surface 77S1 of the second insulating tape 77 and the side surface 75S1 of the first conductive tape 75 may be equal to a width of the electrostatic induction opening OP2 in the second direction DR2.

The gap W1 between the side surface 77S1 of the second insulating tape 77 and the side surface 75S1 of the first conductive tape 75 may be, for example, 1 to 1.5 mm. In other words, a width in the second direction DR2 of a part of the first conductive tape 75 exposed by the second insulating tape 77 may be 1 to 1.5 mm.

Figure 8:
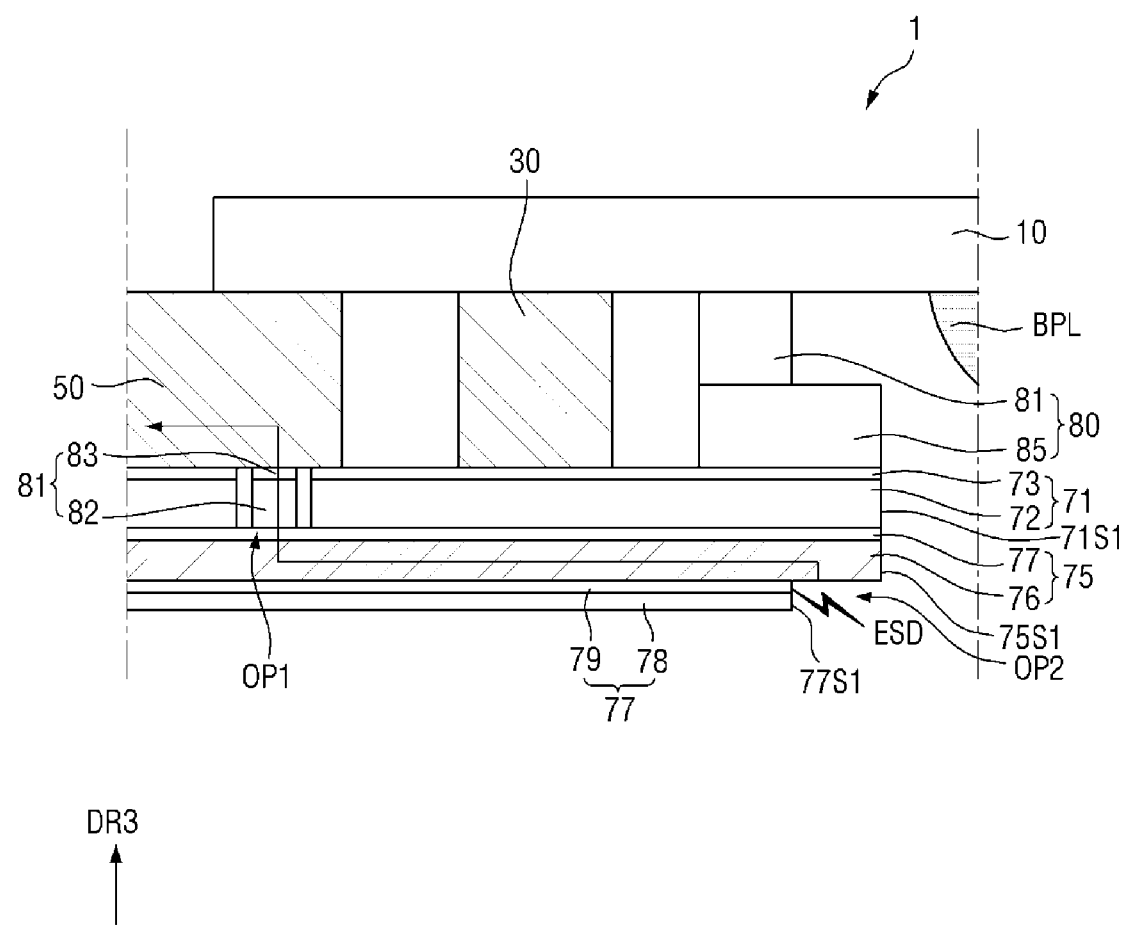
FIG. 8 is a hybrid diagram in cross-sectional view that illustrates induction of external static electricity through an electrostatic induction opening in an exemplary embodiment.

FIG. 8 illustrates induction of external static electricity through the electrostatic induction opening OP2.

Referring to FIG. 8, a gap between the display panel 10 of the display device 1 and the external device and the surrounding set structure disposed on the display panel 10 is narrow. In addition, when the display device 1 is bent, the driving chip 30 is positioned outside the printed circuit film 50 (for example, in the direction opposite to the direction toward the display area DA) and thus located on the periphery of the display device 1 as described above. The driving chip 30 located on the periphery and the driving pads connected to the driving chip 30 may be vulnerable to static electricity introduced directly from the outside. In addition, since the driving chip 30 and the driving pads connected to the driving chip 30 are disposed adjacent to the surrounding set structure, they may be vulnerable to static electricity transferred from the surrounding set structure into which static electricity has been initially introduced. The static electricity introduced directly from the outside and the static electricity introduced indirectly may cause a failure of in the driving chip 30 and the driving pads, and the failure may cause a screen failure of the display device 1.

When external static electricity is present, a static electricity portion ESD may be introduced through the exposed side surface 75S1 of the first conductive tape 75, and this introduced static electricity portion ESD may be induced or diverted through the first conductive tape 75 and the electrostatic transfer openings OP1 to the printed circuit film 50, to which the ground voltage has been applied through the second conductive tape 81, to safely discharge this static electricity portion ESD. However, when the first conductive tape 75 has a relatively small thickness of about 15 μm or less, the amount of the divertible static electricity portion ESD introduced through the exposed side surface 75S1 of the first conductive tape 75 may be insignificant, or almost none. Without a path to divert a greater portion of the external static electricity introduced directly from the outside and the static electricity introduced indirectly, without being intercepted by the conductive layer 75 and diverted through the transfer openings OP1, such static electricity might be undesirably applied to the driving chip 30 located on the periphery and the driving pads connected to the driving chip 30.

Thus, the cover member 70 of the display device 1 according to this exemplary embodiment includes the second electrostatic induction opening OP2, which is considerably wider than the exposed side surface 75S1 of the first conductive tape 75, and this electrostatic induction opening OP2 induces a greater portion or substantially all of the static electricity introduced directly from the outside and the static electricity introduced indirectly through the conductive layer 75 to be diverted through the first electrostatic transfer openings OP1 to the grounded printed circuit film 50. Therefore, it is possible to prevent static electricity from being applied to the driving chip 30 located on the periphery and the driving pads connected to the driving chip 30, thereby preventing a screen failure of the display device 1. Although three electrostatic induction openings OP1 are provided in this exemplary embodiment, it shall be understood that alternate embodiments may include any greater or lesser number of electrostatic induction openings OP1, such as one or twenty, without limitation.

Figure 9:
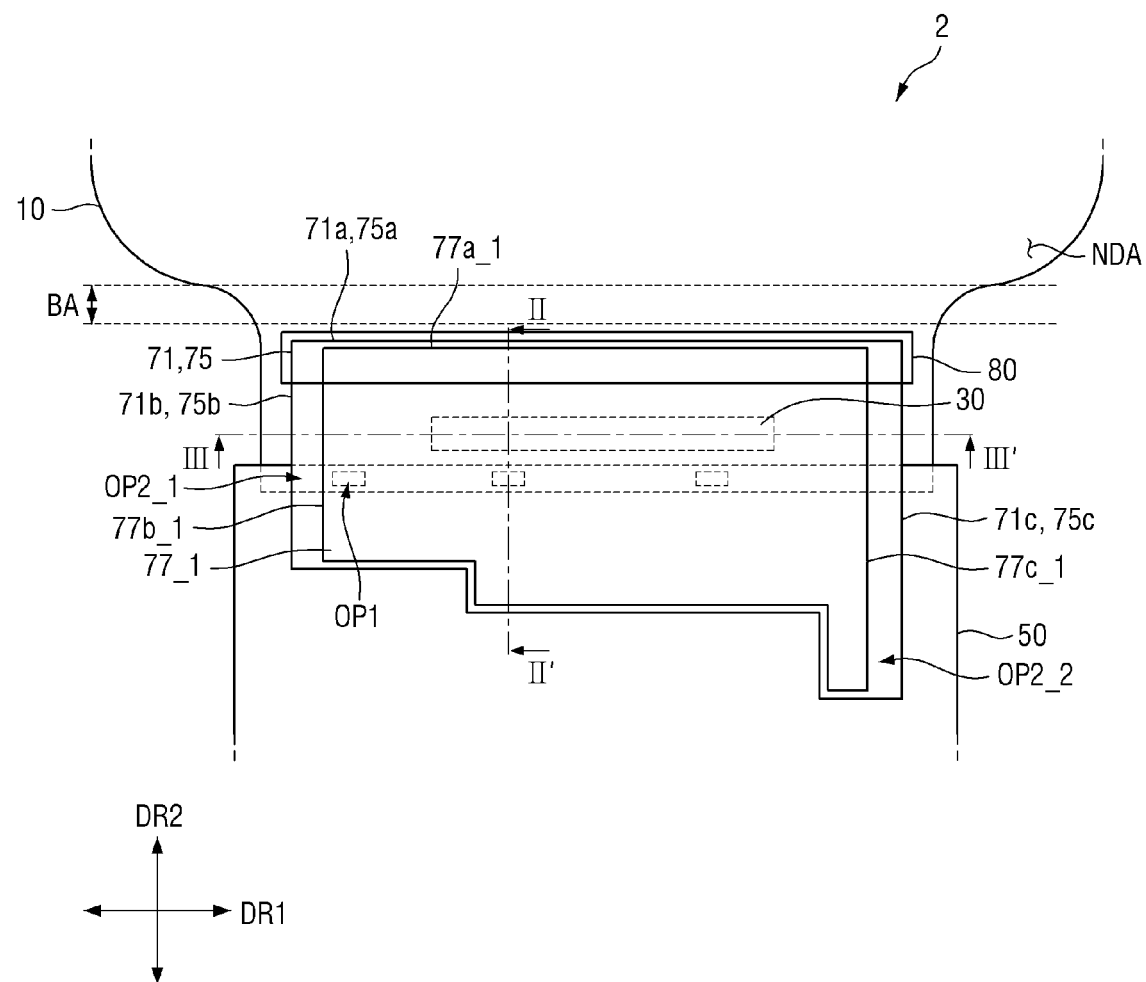
FIG. 9 is a partial layout diagram in plan view of a non-display area of a display panel according to an exemplary embodiment, with a driving chip, a printed circuit film, a cover member, and a step compensation member when the display panel is unbent.
Figure 10:
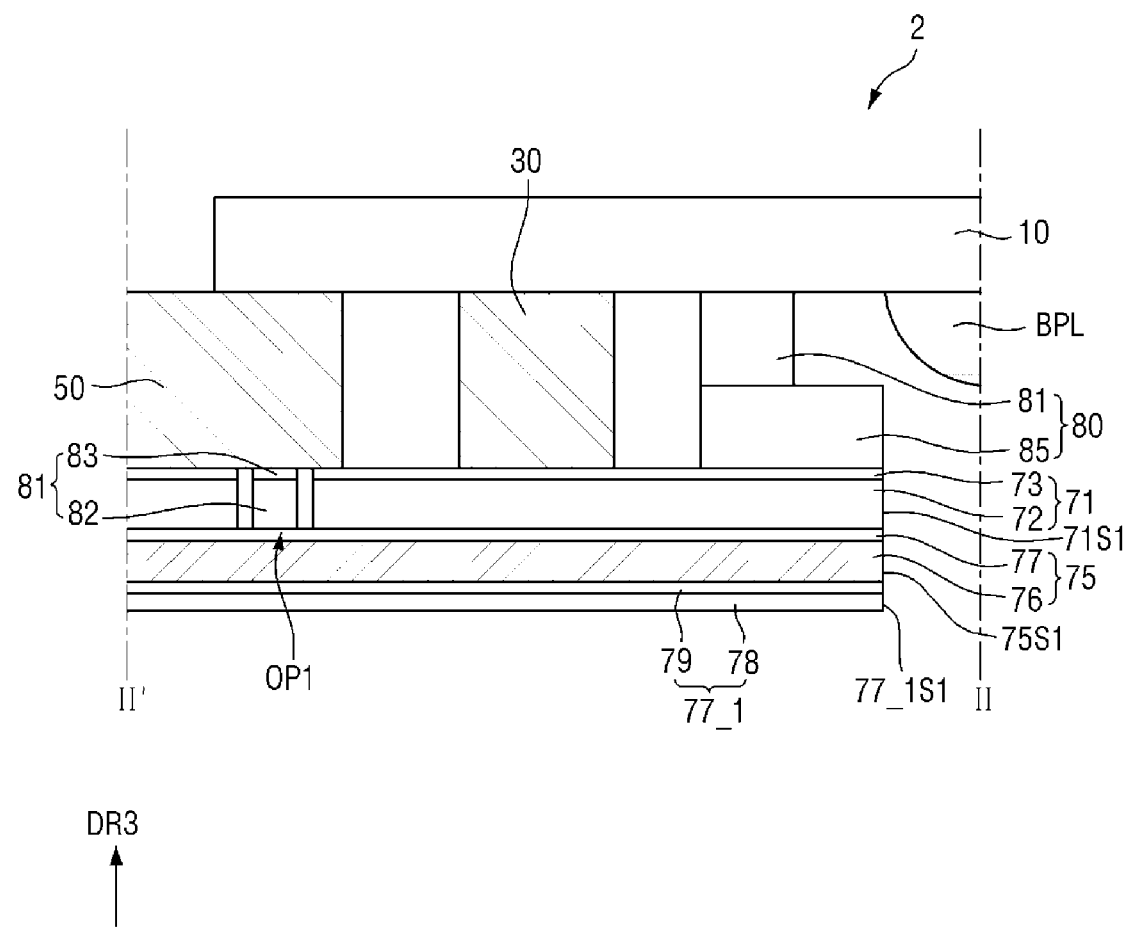
FIG. 10 is a schematic diagram in cross-sectional view taken along line II-II' of FIG. 9 when the display panel is bent.
Figure 11:
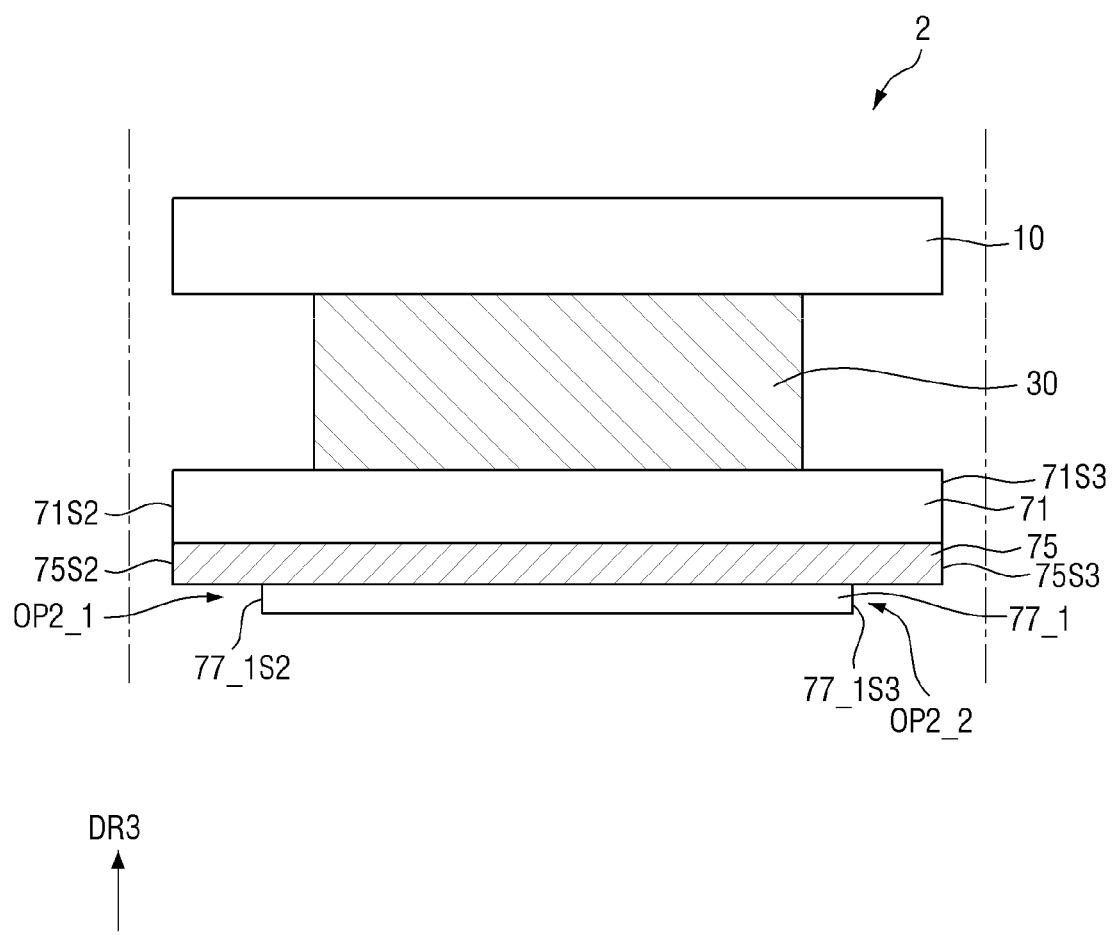
FIG. 11 is a schematic diagram in cross-sectional view taken along line III-III' of FIG. 9 when the display panel is bent.

FIG. 9 illustrates a plan view of a non-display area NDA of a display panel 10 according to an embodiment, a driving chip 30, a printed circuit film 50, a cover member, and a step compensation member 80 when the display panel 10 is unbent. FIG. 10 illustrates a cross-sectional view taken along line II-II' of FIG. 9 when the display panel 10 is bent. FIG. 11 illustrates a cross-sectional view taken along line III-III' of FIG. 9 when the display panel 10 is bent.

Referring to FIGS. 9 through 11, a display device 2 according to the current embodiment is different from the display device 1 of FIGS. 6 and 7 in that an electrostatic induction opening OP2_1 is located between a second end 75b of a first conductive tape 75 and a second end 77b_1 of a second insulating tape 77_1.

More specifically, in the display device 2 according to the current embodiment, the electrostatic induction opening OP2_1 may be located between the second end 75b of the first conductive tape 75 and the second end 77b_1 of the second insulating tape 77_1. Further, an electrostatic induction opening OP2_2 may be disposed between a third end 75c of the first conductive tape 75 and a third end 77c_1 of the second insulating tape 77_1.

First ends 71a and 75a of a first insulating tape 71 and the first conductive tape 75 may be aligned with a first end 77a_1 of the second insulating tape 77_1. Second ends 71b and 75b of the first insulating tape 71 and the first conductive tape 75 may not be aligned with the second end 77b_1 of the second insulating tape 77_1 and may be asymmetrical to the second end 77b_1 of the second insulating tape 77_1 in the thickness direction.

For example, the second ends 71b and 75b of the first insulating tape 71 and the first conductive tape 75 may be located farther from the driving chip 30 than the second end 77b_1 of the second insulating tape 77_1. Likewise, third ends 71c and 75c of the first insulating tape 71 and the first conductive tape 75 may be located farther from the driving chip 30 than the third end 77c_1 of the second insulating tape 77_1. As described above, a planar size of the second insulating tape 77_1 may be smaller than a planar size of the first conductive tape 75. This may be because the second and third ends 77b_1 and 77c_1 of the second insulating tape 77_1 are located closer to the driving chip 30 than the second and third ends 71b, 75b, 71c and 75c of the first insulating tape 71 and the first conductive tape 75.

Each of the first insulating tape 71 and the first conductive tape 75 may protrude from the second and third ends 77b_1 and 77c_1 of the second insulating tape 77 in directions away from the driving chip 30. The electrostatic induction openings OP2_1 and OP2_2 of the second insulating tape 77_1 may be located in each of the protruding parts. In plan view, the electrostatic induction opening OP2_1 may be located between the second end 75b of the first conductive tape 75 and the second end 77b_1 of the second insulating tape 77_1 and the electrostatic induction opening OP2_2 may be located between the third end 75c of the first conductive tape 75 and the third end 77c_1 of the second insulating tape 77_1.

In the electrostatic induction opening OP2_1, a part of the first conductive tape 75 which protrudes from the second end 77b_1 of the second insulating tape 77_1 in the direction away from the driving chip 30 may be completely exposed to the outside. Similarly, in the electrostatic induction opening OP2_2, a part of the first conductive tape 75 which protrudes from the third end 77c_1 of the second insulating tape 77_1 in the direction away from the driving chip 30 may be completely exposed to the outside.

Each of the first insulating tape 71, the first conductive tape 75 and the second insulating tape 77_1 may include side surfaces corresponding to its ends. A side surface 75S1 of the first end 71a of the first conductive tape 75 may be aligned with a side surface 77_1S1 of the first end 77a_1 of the second insulating tape 77_1. Side surfaces 77_1S2 and 77_1S3 of the second end 77b_1 and the third end 77c_1 of the second insulating tape 77_1 may be located closer to the driving chip 30 than side surfaces 75S2 and 75S3 of the second end 75b and the third end 75c of the first conductive tape 75, respectively.

In the current embodiment, the electrostatic induction openings OP2_1 and OP2_2, which are considerably wider than the exposed side surface 75S1 of the first conductive tape 75, may also be included to induce static electricity introduced directly from the outside and static electricity introduced indirectly. Therefore, it is possible to prevent static electricity from being applied to the driving chip 30 located on the periphery and driving pads connected to the driving chip 30, thereby preventing a screen failure of the display device 2. In alternate embodiments, electrostatic induction openings OP2_1 and/or OP2_2 may be included without limitation.

Figure 12:
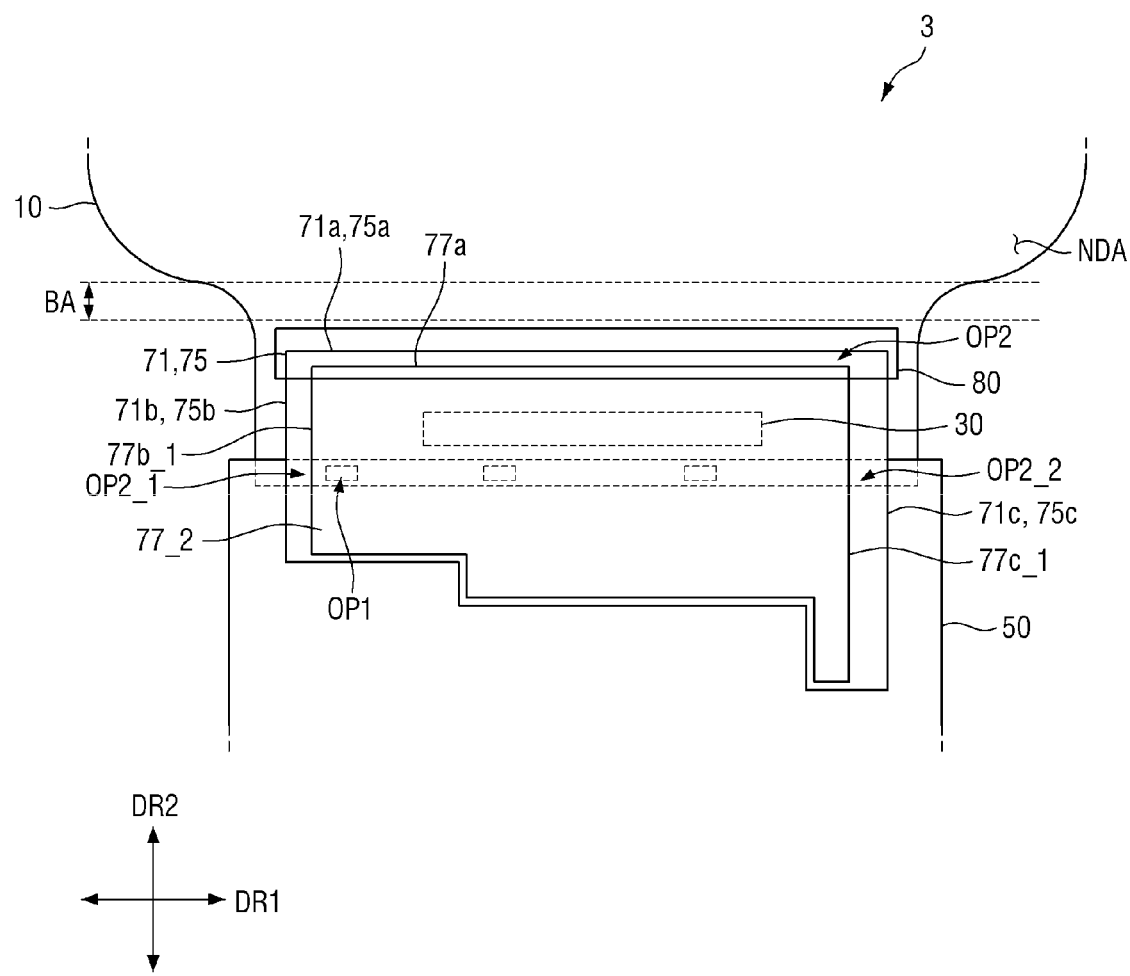
FIG. 12 is partial layout diagram in a plan view of a non-display area of a display panel according to an exemplary embodiment, with a driving chip, a printed circuit film, a cover member, and a step compensation member when the display panel is unbent.

FIG. 12 illustrates a plan view of a non-display area NDA of a display panel 10 according to an embodiment, a driving chip 30, a printed circuit film 50, a cover member, and a step compensation member 80 when the display panel 10 is unbent.

Referring to FIG. 12, a display device 3 according to the current embodiment is different from the display device 1 including the electrostatic induction opening OP2 described above with reference to FIGS. 6 and 7 in that it further includes the electrostatic induction openings OP2_1 and OP2_2 described above with reference to FIGS. 9 through 11.

More specifically, a second insulating tape 77_2 of the display device 3 according to the current embodiment may include the electrostatic induction openings OP2_1 and OP2_2 described above with reference to FIGS. 9 through 11, and the electrostatic induction opening OP2 described above with reference to FIGS. 6 and 7.

The electrostatic induction opening OP2 and the electrostatic induction openings OP2_1 and OP2_2 of the display device 3 according to the current embodiment may surround the driving chip 30 from the first side of the second direction DR2 and the first and second sides of the first direction DR1.

In the current embodiment, the electrostatic induction openings OP2, OP2_1 and OP2_2, which are considerably wider than an exposed side surface 75S1 of a first conductive tape 75, may also be included to induce static electricity introduced directly from the outside and static electricity introduced indirectly towards ground. Therefore, it is possible to prevent static electricity from being applied to the driving chip 30 located on the periphery and driving pads connected to the driving chip 30, thereby preventing a screen failure of the display device 3.

Figure 13:
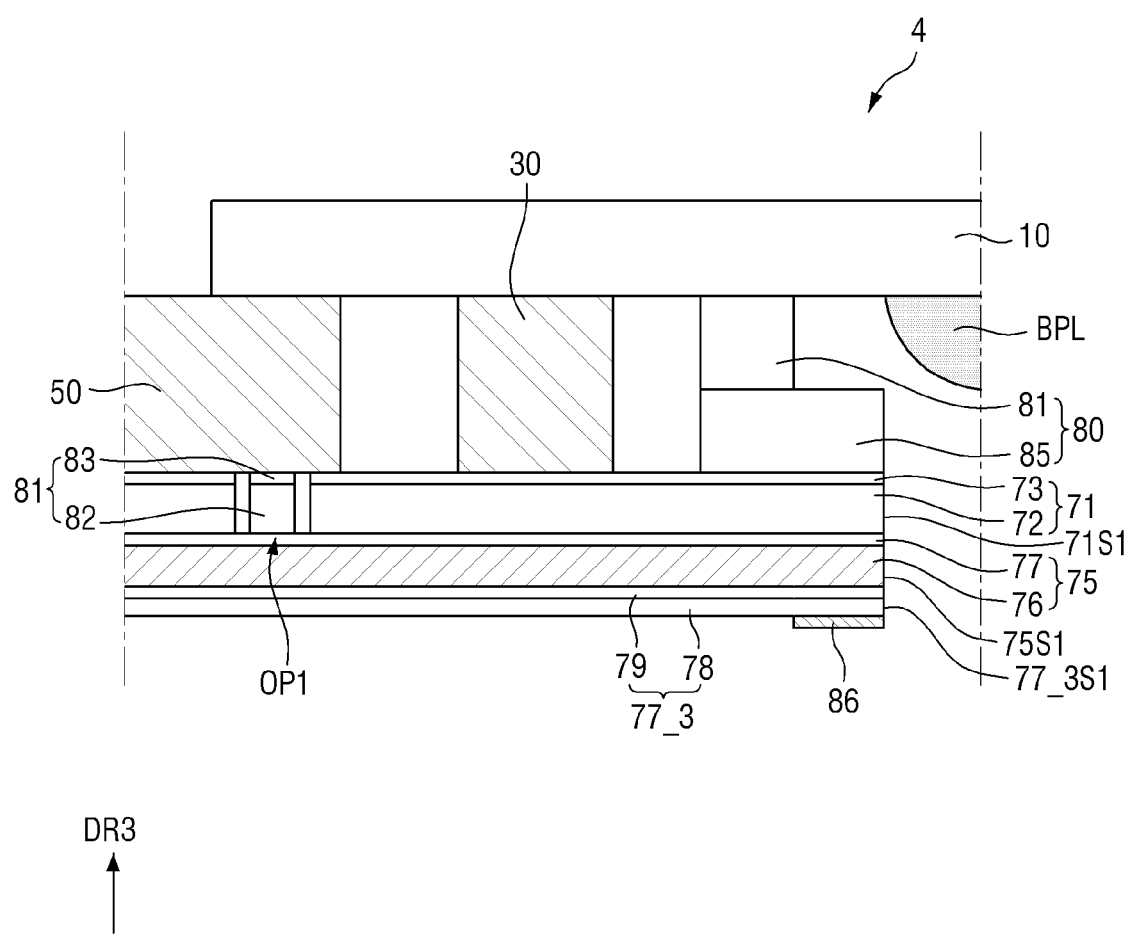
FIG. 13 is a schematic diagram in cross-sectional view of a display device according to an exemplary embodiment.

FIG. 13 illustrates a cross-sectional view of a display device 4 according to an embodiment.

Referring to FIG. 13, the display device 4 according to the current embodiment is different from the display device 1 according to the embodiment of FIG. 7 in that a cover member further includes a conductive layer 86 disposed on a second insulting tape 77_3.

More specifically, in the display device 4 according to the current embodiment, the cover member may further include the conductive layer 86 disposed on the second insulating tape 77_3.

In the cover member according to the current embodiment, side surfaces 71S1 and 75S1 of a first insulating tape 71 and a first conductive tape 75 may be aligned with a side surface 77_3S1 of the second insulating tape 77_3.

The second insulating tape 77_3 may be disposed between the conductive layer 86 and the first conductive tape 75. The conductive layer 86 may be disposed on an edge part (adjacent to a bending area BA) of the second insulating tape 77_3. The conductive layer 86 may overlap the edge part (adjacent to the bending area BA) of the second insulating tape 77_3 in the thickness direction. The side surface 71S1 of the first insulating tape 71, the side surface 75S1 of the first conductive tape 75, and the side surface 77_3S1 of the second insulating tape 77_3 may be exposed to the outside.

The conductive layer 86 may include at least one of the materials mentioned as example materials of a second base 76 of the first conductive tape 75.

In the current embodiment, since the display device 4 further includes the conductive layer 86 overlapping, in the thickness direction, the edge part (adjacent to the bending area BA) of the second insulating tape 77_3 located on an outermost side of the cover member, static electricity introduced directly from the outside and static electricity introduced indirectly may be induced to the conductive layer 86 and conducted to the first conductive tape 75 because the second insulating tape 77_3 is thinner than the first conductive tape 75. Therefore, it is possible to prevent static electricity from being applied to a driving chip 30 located on the periphery and driving pads connected to the driving chip 30, thereby preventing a screen failure of the display device 4. In an alternate embodiment where the second insulating tape 77_3 need not be thinner than the first conductive tape 75, the conductive layer 86 may be disposed on an electrostatic induction opening OP3 that extends through the second insulating tape 77_3 to the first conductive tape 75.

Figure 14:
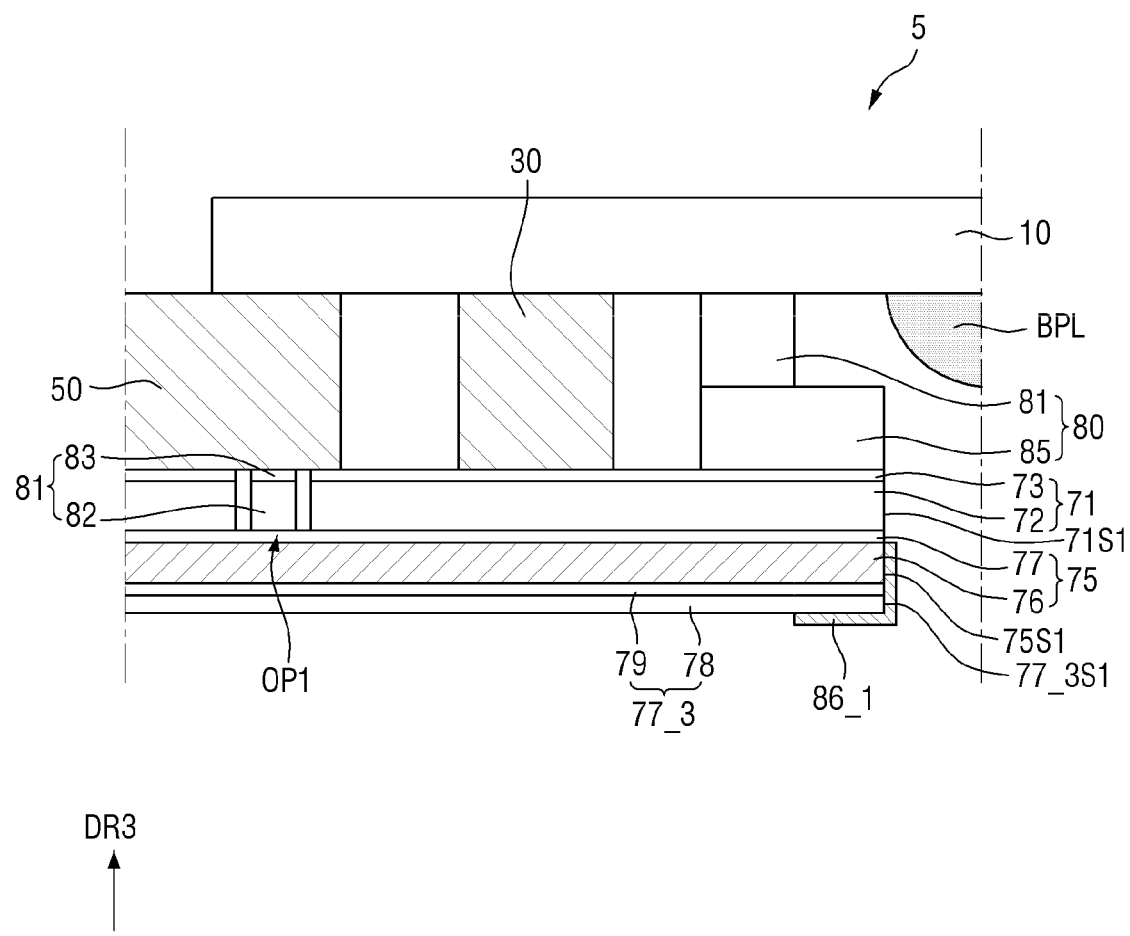
FIG. 14 is a schematic diagram in cross-sectional view of a display device according to an exemplary embodiment.

FIG. 14 illustrates a cross-sectional view of a display device 5 according to an embodiment.

Referring to FIG. 14, the display device 5 according to the current embodiment is different from the display device 4 of FIG. 13 in that a conductive layer 86_1 is further disposed on a side surface 77_3S1 of a second insulating tape 77_3 and a side surface 75S1 of a first conductive tape 75.

More specifically, in the display device 5 according to the current embodiment, the conductive layer 86_1 may be further disposed on the side surface 77_3S1 of the second insulating tape 77_3 and the side surface 75S1 of the first conductive tape 75.

Since the conductive layer 86_1 is further disposed on the side surface 77_3S1 of the second insulating tape 77_3 and the side surface 75S1 of the first conductive tape 75, it may be electrically connected to the first conductive tape 75.

In the current embodiment, since the display device 5 further includes the conductive layer 86_1 overlapping, in the thickness direction, an edge part (adjacent to a bending area BA) of the second insulating tape 77_3 located on an outermost side of the cover member, static electricity introduced directly from the outside and static electricity introduced indirectly may be induced to the conductive layer 86_1 and conducted directly to the first conductive tape 75. Therefore, it is possible to prevent static electricity from being applied to a driving chip 30 located on the periphery and driving pads connected to the driving chip 30, thereby preventing a screen failure of the display device 5. In an alternate embodiment, the conductive layer 86_1 may be disposed on an electrostatic induction opening OP3 that extends through the second insulating tape 77_3 to the first conductive tape 75.

In a display device according to the present disclosure, display screen failures due to external stress, for example, static electricity can be improved.

However, the effects of the embodiments are not restricted to the one set forth herein. The above and other effects of the embodiments will become more apparent to one of daily skill in the art to which the embodiments pertain by referencing the claims.

While the present disclosure has been particularly shown and described with reference to exemplary embodiments thereof, it will be understood by those of ordinary skill in the pertinent art that various changes in form and details may be made herein without departing from the scope or spirit of the present disclosure as defined by the following claims and their equivalents. The exemplary embodiments should be considered in a descriptive sense, only, and not for purposes of limitation.

What is claimed is:

1. A display device comprising:
   a display panel in which a display area and a non-display area located around the display area are defined;
   an external device which is disposed on the non-display area of the display panel; and
   a cover member which is disposed on the external device,
   wherein the cover member comprises a first conductive tape disposed on the external device and a first insulating tape disposed on the first conductive tape,
   wherein the first insulating tape comprises an electrostatic induction opening penetrating the first insulating tape in a thickness direction,
   wherein a planar size of the first conductive tape is greater than a planar size of the first insulating tape.

2. The display device of claim 1, wherein the external device comprises a driving chip and a printed circuit film which is disposed on the non-display area of the display panel and spaced apart from the display area with the driving chip interposed between the printed circuit film and the display area in plan view.

3. The display device of claim 2,
   wherein the cover member further comprises a second insulating tape disposed between the external device and the first conductive tape, and the first conductive tape is disposed between the first insulating tape and the second insulating tape.

4. The display device of claim 3,
   wherein the first conductive tape protrudes further toward the display area than the first insulating tape in plan view.

5. The display device of claim 4, wherein the second insulating tape comprises an electrostatic transfer opening overlapping the printed circuit film, and the electrostatic transfer opening completely penetrates the second insulating tape in the thickness direction.

6. The display device of claim 5, wherein the cover member further comprises a second conductive tape disposed in the electrostatic transfer opening, the second conductive tape is disposed between the first conductive tape and the printed circuit film, the second conductive tape is configured to electrically connect the first conductive tape and the printed circuit film, and the printed circuit film is configured to receive a ground voltage.

7. The display device of claim 6, wherein the non-display area further comprises a bending area located between the driving chip and the display area in plan view, and the display panel is bent in the thickness direction in the bending area.

8. The display device of claim 7, further comprising a bending protection layer which is disposed on the bending area of the display panel.

9. The display device of claim 8, further comprising a step compensation member which is disposed between the display panel and the first insulating tape.

10. The display device of claim 9, wherein the step compensation member comprises a first step compensation member disposed between the display panel and the first insulating tape and a second step compensation member disposed between the first step compensation member and the first insulating tape, and an inner side surface of the first step compensation member is located farther from the bending area than an inner side surface of the second step compensation member.

11. The display device of claim 1, wherein the electrostatic induction opening is disposed on at least one of the portions in which the first conductive tape protrudes from the first insulating tape in a plan view.

12. The display device of claim 11, wherein the external device comprises a driving chip and a printed circuit film which is disposed on the non-display area of the display panel and spaced apart from the display area with the driving chip interposed between the printed circuit film and the display area in plan view.

13. The display device of claim 12,
wherein the cover member further comprises a second insulating tape disposed between the external device and the first conductive tape, and the first conductive tape is disposed between the first insulating tape and the second insulating tape.

14. The display device of claim 13,
wherein the first conductive tape protrudes further toward the display area than the first insulating tape in plan view.

15. The display device of claim 14, wherein the second insulating tape comprises an electrostatic transfer opening overlapping the printed circuit film, and the electrostatic transfer opening completely penetrates the second insulating tape in the thickness direction.

16. The display device of claim 15, wherein the cover member further comprises a second conductive tape disposed in the electrostatic transfer opening, the second conductive tape is disposed between the first conductive tape and the printed circuit film, the second conductive tape is configured to electrically connect the first conductive tape and the printed circuit film, and the printed circuit film is configured to receive a ground voltage.

17. The display device of claim 16, wherein the non-display area further comprises a bending area located between the driving chip and the display area in plan view, and the display panel is bent in the thickness direction in the bending area.

18. The display device of claim 17, further comprising a bending protection layer which is disposed on the bending area of the display panel.

19. The display device of claim 18, further comprising a step compensation member which is disposed between the display panel and the first insulating tape.

20. The display device of claim 19, wherein the step compensation member comprises a first step compensation member disposed between the display panel and the first insulating tape and a second step compensation member disposed between the first step compensation member and the first insulating tape, and an inner side surface of the first step compensation member is located farther from the bending area than an inner side surface of the second step compensation member.

* * * * *